United States Patent
Chen et al.

(10) Patent No.: US 9,984,920 B2
(45) Date of Patent: May 29, 2018

(54) DESIGN-AWARE PATTERN DENSITY CONTROL IN DIRECTED SELF-ASSEMBLY GRAPHOEPITAXY PROCESS

(71) Applicant: INTERNATIONAL BUSINESS MACHINES CORPORATION, Armonk, NY (US)

(72) Inventors: Hsueh-Chung Chen, Cohoes, NY (US); Cheng Chi, Jersey City, NJ (US); Lin Hu, Cohoes, NY (US); Kafai Lai, Poughkeepsie, NY (US); Chi-Chun Liu, Altamont, NY (US); Jed W. Pitera, Portola Valley, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/206,789

(22) Filed: Jul. 11, 2016

(65) Prior Publication Data

US 2018/0012795 A1    Jan. 11, 2018

(51) Int. Cl.
| | |
|---|---|
| *G06F 17/50* | (2006.01) |
| *H01L 21/768* | (2006.01) |
| *H01L 23/528* | (2006.01) |
| *H01L 23/522* | (2006.01) |
| *H01L 21/02* | (2006.01) |

(52) U.S. Cl.
CPC .... *H01L 21/76816* (2013.01); *G06F 17/5072* (2013.01); *H01L 21/02118* (2013.01); *H01L 21/02318* (2013.01); *H01L 23/528* (2013.01); *H01L 23/5226* (2013.01)

(58) Field of Classification Search
CPC ............ G06F 17/5072; G06F 17/5077; G06F 17/5081; G06F 2217/12
USPC ......................................... 716/110, 118, 119
See application file for complete search history.

(56) References Cited

U.S. PATENT DOCUMENTS

| | | | |
|---|---|---|---|
| 6,185,472 B1 | 2/2001 | Onga et al. | |
| 6,745,380 B2 | 6/2004 | Bodendorf et al. | |
| 7,175,940 B2 * | 2/2007 | Laidig et al. ............. | G03F 1/36 382/144 |
| 7,503,028 B2 * | 3/2009 | Mukherjee et al. ...... | G03F 1/36 716/51 |
| 7,509,616 B2 * | 3/2009 | Uchida ............... | G06F 17/5081 716/126 |
| 7,598,174 B1 * | 10/2009 | Zhuang ............... | H01L 21/0334 257/E21.579 |
| 7,673,258 B2 * | 3/2010 | Kyoh .................. | G06F 17/5077 716/112 |
| 7,754,401 B2 * | 7/2010 | Fujimura et al. ...... | B82Y 10/00 430/296 |
| 7,814,456 B2 | 10/2010 | Gupta et al. | |

(Continued)

*Primary Examiner* — Sun Lin
(74) *Attorney, Agent, or Firm* — Tutunjian & Bitetto, P.C.; Vazken Alexanian

(57) ABSTRACT

A method for local pattern density control of a device layout used by graphoepitaxy directed self-assembly (DSA) processes includes importing a multi-layer semiconductor device design into an assist feature system and determining overlapping regions between two or more layers in the multi-layer semiconductor device design using at least one Boolean operation. A fill for assist features is generated to provide dimensional consistency of device features by employing the overlapping regions to provide placement of the assist features. An updated device layout is stored in a memory device.

20 Claims, 10 Drawing Sheets

(56) References Cited

U.S. PATENT DOCUMENTS

| | | | |
|---|---|---|---|
| 7,820,341 B2* | 10/2010 | Laidig et al. | G03F 1/36 |
| | | | 382/144 |
| 8,232,211 B1* | 7/2012 | Clevenger et al. | B81C 1/00031 |
| | | | 257/E21.038 |
| 8,237,914 B2* | 8/2012 | Mos | G03F 7/70258 |
| | | | 355/52 |
| 8,336,003 B2 | 12/2012 | Cheng et al. | |
| 8,392,871 B2* | 3/2013 | Mansfield et al. | G03F 7/203 |
| | | | 716/119 |
| 8,423,945 B2 | 4/2013 | Bickford et al. | |
| 8,667,428 B1 | 3/2014 | Latypov | |
| 8,667,430 B1 | 3/2014 | Latypov | |
| 8,918,746 B1 | 12/2014 | Yuan et al. | |
| 9,026,955 B1* | 5/2015 | Wang et al. | G03F 1/36 |
| | | | 716/50 |
| 9,305,834 B1 | 4/2016 | Latypov et al. | |
| 9,317,645 B2* | 4/2016 | Hamouda | G06F 17/5077 |
| 9,330,221 B2 | 5/2016 | Yuan et al. | |
| 9,411,924 B2* | 8/2016 | Wang et al. | G06F 17/5081 |
| 9,672,320 B2* | 6/2017 | Chang et al. | G06F 17/5081 |
| 2015/0040091 A1* | 2/2015 | Hamouda | G06F 17/5072 |
| | | | 716/119 |
| 2015/0106779 A1 | 4/2015 | Wang et al. | |
| 2015/0339428 A1 | 11/2015 | Yuan et al. | |

\* cited by examiner

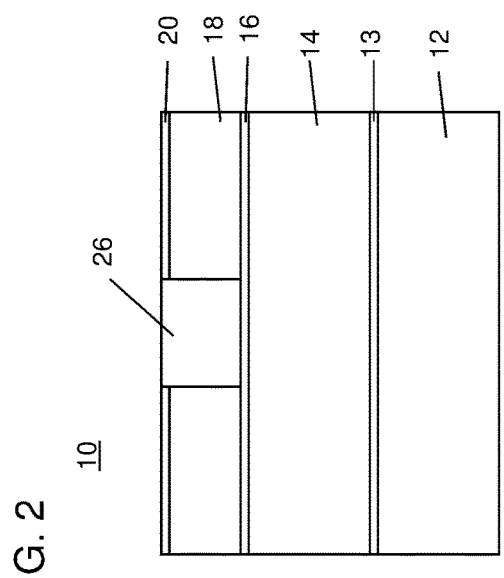
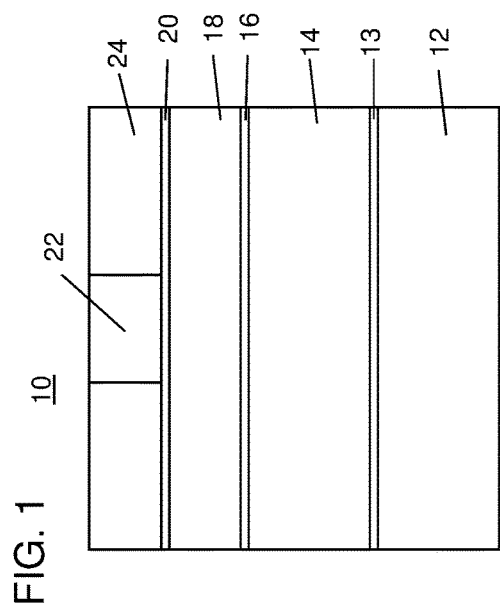
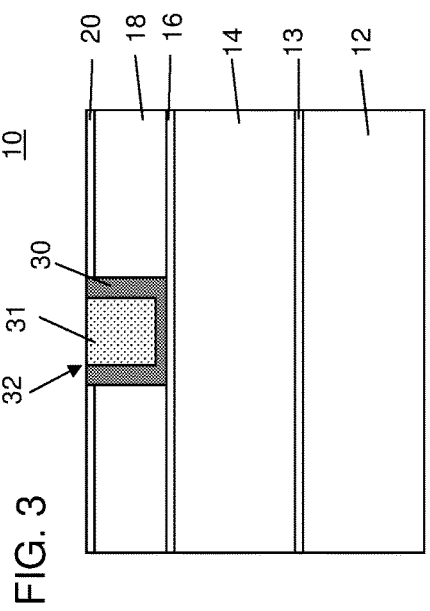
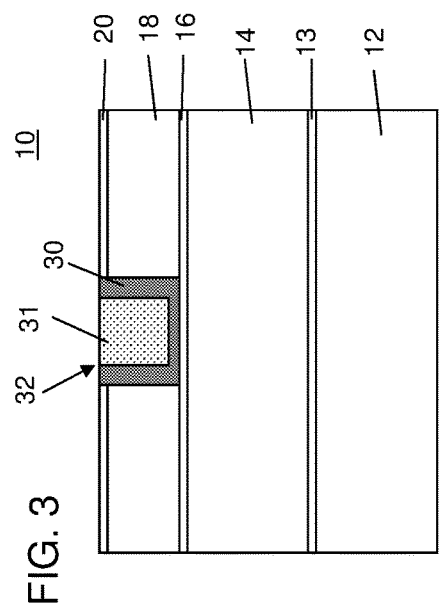

DESIGN-AWARE PATTERN DENSITY CONTROL IN DIRECTED SELF-ASSEMBLY GRAPHOEPITAXY PROCESS

BACKGROUND

Technical Field

The present invention generally relates to semiconductor device fabrication, and more particularly, to devices and methods for pattern density control to form assist features in directed self-assembly applications.

Description of the Related Art

Directed self-assembly (DSA) of block copolymers (BCPs) has emerged as a useful tool in semiconductor processing. A BCP is composed of two or more strands of chemically distinct polymers binding linearly together. BCPs, upon annealing, can phase-separate into uniform polymer micro-domains whose dimension is about tenths of nanometer. DSA includes providing physical guides, mandrels or templates with chemical contrast, to direct BCPs micro-domains into useful structures, e.g., parallel lines and the like. DSA may be employed, e.g., to form interconnect lines, spacers and/or contacts.

Graphoepitaxy Directed Self-Assembly (DSA) of block copolymers (BCPs) for via/contact shrink processes utilizes a topographical guiding pattern to drive feature assembly. Spin-coating BCPs over topographical substrates results in film thickness variation across a wafer, especially when pattern density varies. Such thickness variations affect pattern transfer and restrict allowable designs. Adding assist features (or "fill") to balance local pattern density can be adopted to reduce variations; however, state-of-the-art DSA assist features only consider single plane density control.

SUMMARY

In accordance with an embodiment of the present principles, a method for pattern density control of a device layout includes importing a multi-layer semiconductor device design into an assist feature generation system and determining overlapping regions between two or more layers in the multi-layer semiconductor device design using at least one Boolean operation. A fill for assist features is generated to provide dimensional consistency of device features by employing the overlapping regions to provide placement of the assist features. An updated device layout is stored in a memory device.

A non-transitory computer readable storage medium includes a computer readable program for pattern density control of a device layout, wherein the computer readable program when executed on a computer causes the computer to perform the steps of importing a multi-layer semiconductor device design into an assist feature system; determining overlapping regions between two or more layers in the multi-layer semiconductor device design using at least one Boolean operation; generating a fill for assist features to provide dimensional consistency of device features by employing at least the overlapping regions to provide placement of the assist features; and storing an updated device layout in a memory device.

A semiconductor device includes multiple metallization layers and at least one region determined to be free of assist features based upon a presence of an overlap between metal layers between the multiple metallization layers of the device. A fill for assist features is formed on one or more layers of the semiconductor device to provide dimensional consistency of device features, the assist features being placed in accordance with the overlap to provide placement of the assist features.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1 is a cross-sectional view showing a substrate having masking layers with a lithographically formed via hole in accordance with the present principles;

FIG. 2 is a cross-sectional view showing the via hole extended through an anti-reflection coating (ARC) and into a masking layer (e.g., optical planarization layer (OPL)) in accordance with the present principles;

FIG. 3 is a cross-sectional view showing copolymer material formed in the via hole and annealed to separate the copolymer materials in accordance with the present principles;

FIG. 4 is a cross-sectional view showing one block of the BCP materials removed from the via hole in accordance with the present principles;

DETAILED DESCRIPTION

Figure 5:
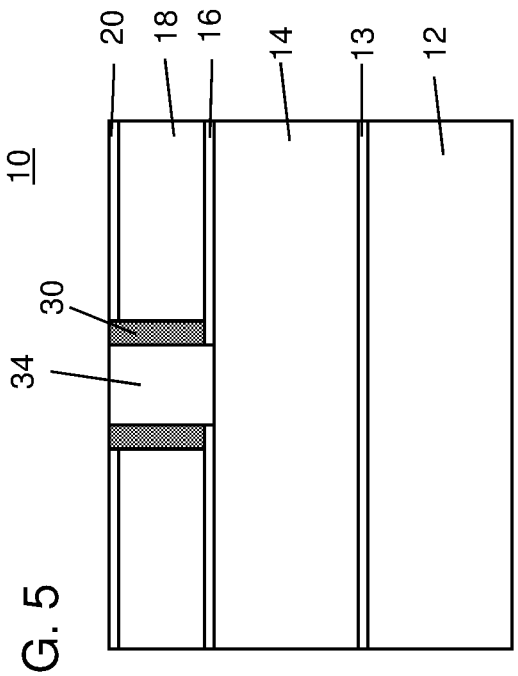
FIG. 5 is a cross-sectional view showing the remaining copolymer material etched through (break through) to continue to fabricate the via hole in accordance with the present principles.

In accordance with the present principles, systems and methods are provided for reducing film thickness variations across a wafer by controlling pattern density. In one embodiment, assist features in high risk areas of the layout are avoided. High risk areas may be areas which can potentially have short circuits, especially between layers. In one embodiment, a method is provided that employs BOOLEAN operations on all related layers to define prohibited areas for assist features (fill). In this way, the fill will only be added to non-critical regions to greatly improve process variation tolerances.

In one example, e.g., high risk areas may include regions of overlap between metal layers or where metal layers overlap and are connected with vias, e.g., M0/V0/M1, where M0 is a lower metal layer, M1 is an adjacent metal layer and V0 is via pattern connecting M0 and M1.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, etc., which typically include multiple copies of the chip design in question that are to be formed on a wafer. The photolithographic masks, etc. are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below" "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a process for graphoepitaxy directed self-assembly (DSA) of block copolymers (BCPs) is illustratively shown for a via or contact shrink process that utilizes a topographical guiding pattern (GP) to drive self-assembly. A partially fabricated semiconductor device 10 is depicted for formation of DSA materials in accordance with an illustrative embodiment. The device 10 will be subjected to an illustrative graphoepitaxy flow. However, it should be understood that different structures, layers and materials may be employed in accordance with the present principles. To provide a high-resolution etch template (e.g., vias or lines less than about 25 nm in width, and preferably less than about 15 nm), a DSA template needs to be defined using a lithographic method that also is compatible with the DSA material layer. The process creates high resolution templates for DSA with guide features that can control densities of features for the DSA template to ensure less film thickness variation across the device 10.

In one embodiment, a lithographic stack is formed on a substrate 12. The substrate 12 is provided having a hardmask (HM) layer 13 formed thereon. The substrate 12 may include a substrate, such as, e.g., silicon (Si), silicon germanium (SiGe), germanium (Ge), III-V material (e.g., GaAs), silicon oxide, silicon nitride, titanium nitride, etc. The substrate 12 may be employed for forming fin field effect transistors (finFETs) or other electronic devices, e.g., diodes, transistors, capacitors, etc. Other materials may be employed for the substrate 12 as well, e.g., ceramics, etc. depending on the application. The hard mask layer 13 may include a nitride material or the like. A mask layer 14 may include an optical planarization layer (OPL) and is formed on the hard mask 13 by, e.g., a spin coating process. An inorganic hard mask (HM) layer 16, e.g. nitride or oxide, may be formed on the mask layer 14. The mask layer 14 formed from OPL may be spun on and baked, or can be deposited by chemical vapor deposition (CVD). OPL 14 can be baked at lower temperatures, such as 150-200 degrees C., if desired.

A second mask layer (OPL) 18 is formed on the HM 16 by a similar process as mask layer (OPL) 14, and an anti-reflection coating (ARC) layer (e.g., Si ARC) 20 is formed on the OPL 18 by spin-coating or CVD. A resist layer 24 is spin coated over a surface of ARC 20, and patterned by known lithographic processes to form pattern shapes (via opening) 22.

Referring to FIG. 2, the shapes 22 are employed as an etch mask to etch through the SiARC 20 and OPL 18. The etch process preferably includes a reactive ion etch (RIE). The RIE is employed with a chemistry and power to remove the unprotected portions of the SiARC 20 and OPL 18, and portions of the SiARC 20 and OPL 18 that are protected by the resist 24 are removed to form opening 26. The etching stops on the SiARC 16. The resist layer 24 is consumed during the etch process.

Referring to FIG. 3, a DSA material 32 is formed in the openings 26. In one embodiment, the DSA material 32 includes block copolymer (BCP), which may include poly (styrene)-b-poly(methyl methacrylate diblock copolymers (PS-b-PMMA)), poly(styrene)-block-poly(hydroxystyrene) diblock copolymers (PS-b-PHOST), polystyrene-b-poly lactic acid (PS-b-PLA) and/or other DSA materials.

In accordance with one useful embodiment, the DSA material 32 includes a mixture of PS-b-PMMA with different molecular weight, compositions, and either or both of its homopolymers. The DSA material 32 may be spun onto the device 10 or may otherwise be dispensed to coat the surface.

In one embodiment, the DSA material 32 includes a cylinder or lamella forming block copolymer (BCP), which is graphoepitaxially driven to form a cup 30 (PS) and a cylinder 31 (PMMA) within the cup 30. A thin layer of PMMA may exist outside the cup, but is not illustrated here for simplification.

The DSA material 32 is subjected to an anneal process. The anneal process may include a temperature of about 150 to 300 degrees C. for between about 1 minute to 10 hours. The anneal process causes the micro-phase separation of the BCPs and form nanoscale domains, e.g., cylinder 31 and cup 30. In one embodiment, region (cylinder) 31 includes PMMA material or PLA material, and regions (cup) 30 include PS material. It should be understood that assist features as will be described are formed in a same way as the vias by forming holes and filling the holes with BCPs during DSA processing. However, critical dimensions (CDs) of the guiding patterns of the assist features vary and result in different morphologies than those in the guiding patterns of the main features. The assist features may be formed within a layer or one a surface, as needed.

Referring to FIG. 4, the region 31 (PMMA) is removed by a selective etch process. This leaves an opening 34, which will be employed as an etch mask for opening up the layers 16 and 14 below. Since the original opening 22 may be the minimum feature size using lithography, the opening 34 is sub-minimum feature size.

Figure 6:
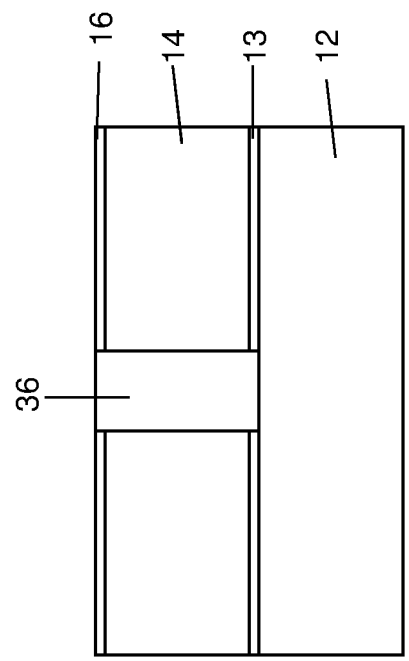
FIG. 6 is a cross-sectional view showing the via hole formed in a masking layer in accordance with the present principles.

Referring to FIGS. 5 and 6, another etch process is performed to breakthrough a bottom of the cup 30 to etch the HM 16 and the mask layer 14. This forms a reduced size via opening 36 and further etching may be performed into the substrate 12 (or other underlying layer. In further steps, a metal may deposited to form the via. The metal preferably includes Cu, W, Al or Ti although similar metals may be employed.

The above process is employed for via openings and may include a grid of assist features in a pattern that assists the formation of the via openings. The grid of assist features needs to be properly placed and sized to obtain properly placed and sized main features (e.g., via openings). By way of example, DSA of BCP in assist features with ~5-10 nm smaller than an optimum critical dimension (CD) of a main feature will assemble into structures that cannot be etch transferred. The CDs of main features can be achievable at a proper size when employing assist features ~10 nm smaller than the main features. For example, if a CD from a guiding pattern of a main feature (26, via opening) is between about 62-64 nm, than the target CD for assist features can be between about 50 nm to about 56 nm.

Due to the nature of lithography, sub-optimum CDs are subject to larger process variation, even with the help from optical proximity correction (OPC). As a result, some of the DSA assist feature patterns could be either etch transferable or inadequate. In accordance with the present principles, an area with higher tolerance to process variation is found based on metal layer designs.

Figure 7:
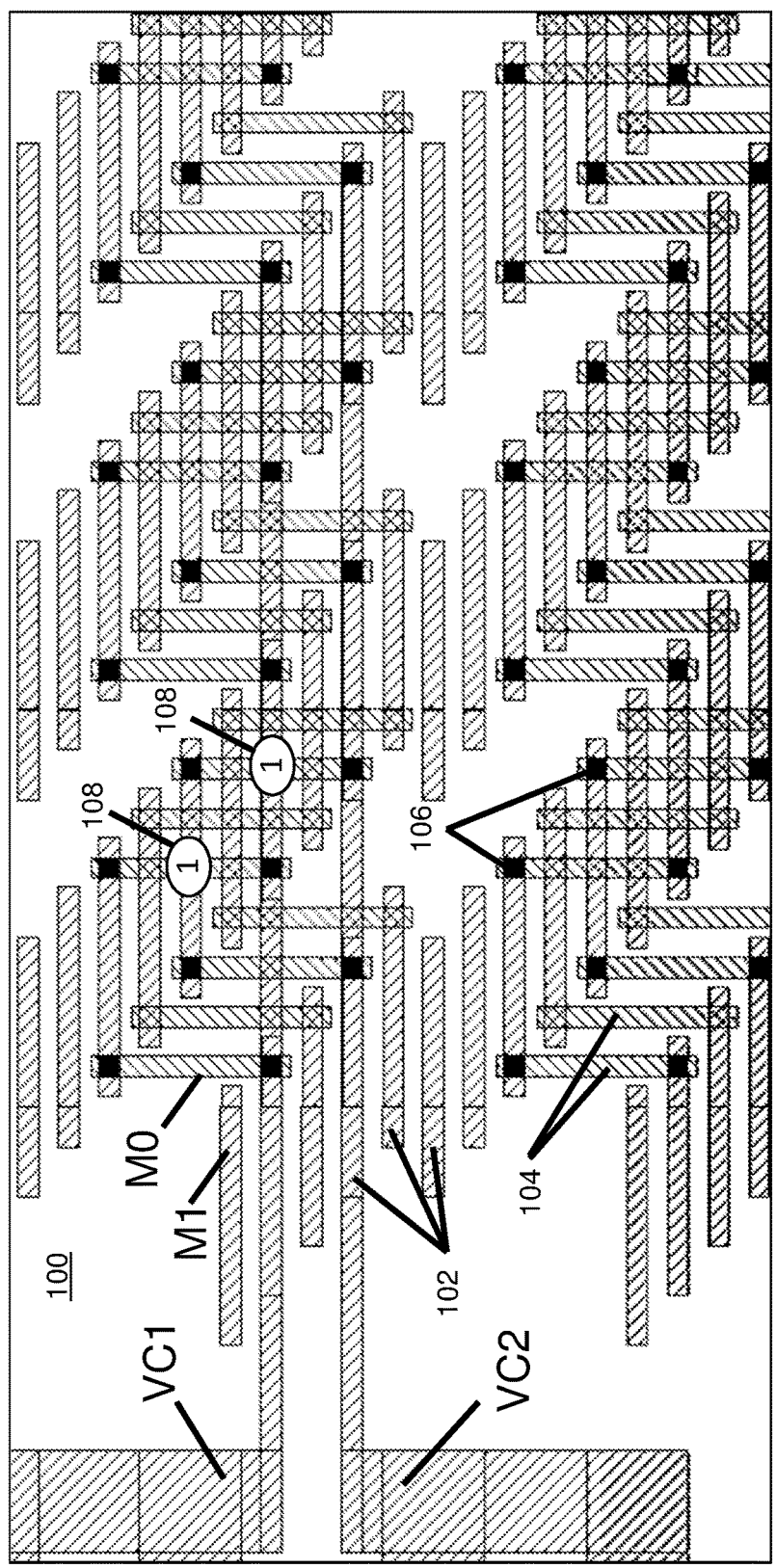
FIG. 7 is an illustrative design layout showing potential issues solved in accordance with one embodiment of the present principles.

Referring to FIG. 7, an illustrative layout 100 is shown for two metal lines and a via layer connecting between the metal layers to describe issues to be solved in accordance with the present principles. As an example, metal layer M0 104 includes vertically disposed lines while metal layer M1 102 is horizontally disposed. The metal layers 102 and 104 are offset in height (into the page). Vias (V0) 106 connect the metal layer at selected positions. Two sets of electrically independent via-chains are provided in this macro, i.e., VC1 and VC2. Functional vias 106 are located at the intersection of M0 and M1. Locations 108 are examples where a conventional "gridded" DSA assist features will be placed. If the size of the assist feature is off target due to process variation and unintended DSA vias were to appear at locations 108, the two sets of via-chains VC1 and VC2 will be electrically shorted.

As set forth above, the lack of assist features or the presence of over-sized assist features may result in consequences in nearby structures on the same layer or on different layers within the structure. The following will describe methods and devices for addressing these issues in a repeatable and structured manner.

Figure 8:
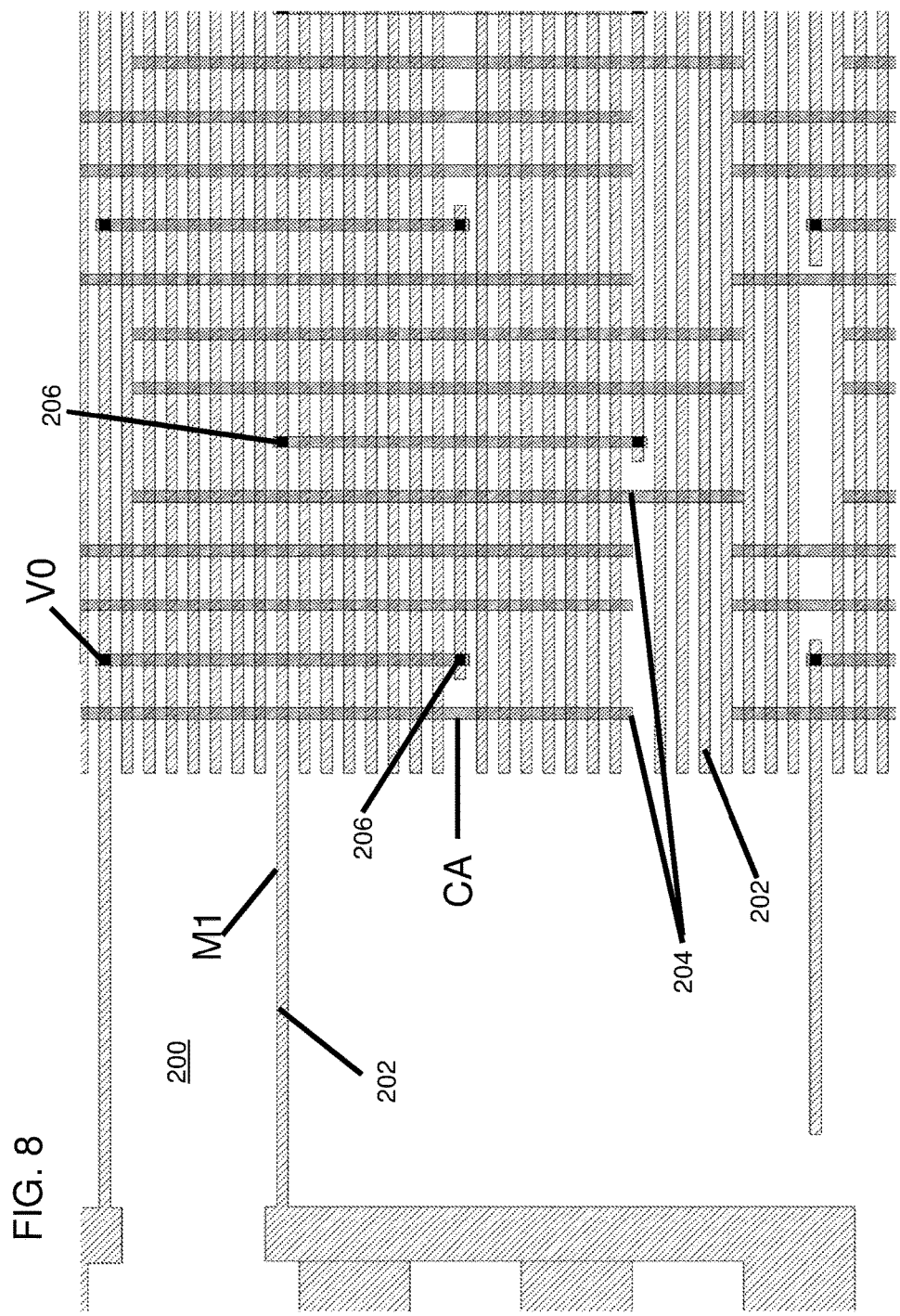
FIG. 8 is an illustrative design layout with multiple metal layers showing an input design to be employed in generating assist features in accordance with one embodiment of the present principles.

Referring to FIG. 8, a design-aware DSA assist feature placement methodology will be illustratively described in accordance with an example. An incoming design 200 sent to a system for determining assist feature placement is provided. The incoming design 200 shows a small portion of the overall design 200 and includes three layers. A first layer CA includes a first layer of metal lines 204. A second layer M1 includes a layer of metal lines 202 transversely oriented with respect to the metal lines 204. The design 200 includes vias V0, which provide connections 206 between the M1 and CA or other structures. The connections 206 may include via chains that extend to other layers as well. The design 200 may be represented in a graphical image or map or may be included as coordinate data in a computer file. The coordinate data may store a three dimensional coordinate and have associated with that coordinate a structure (e.g., CA, M1, V0, empty, etc.)

Figure 9:
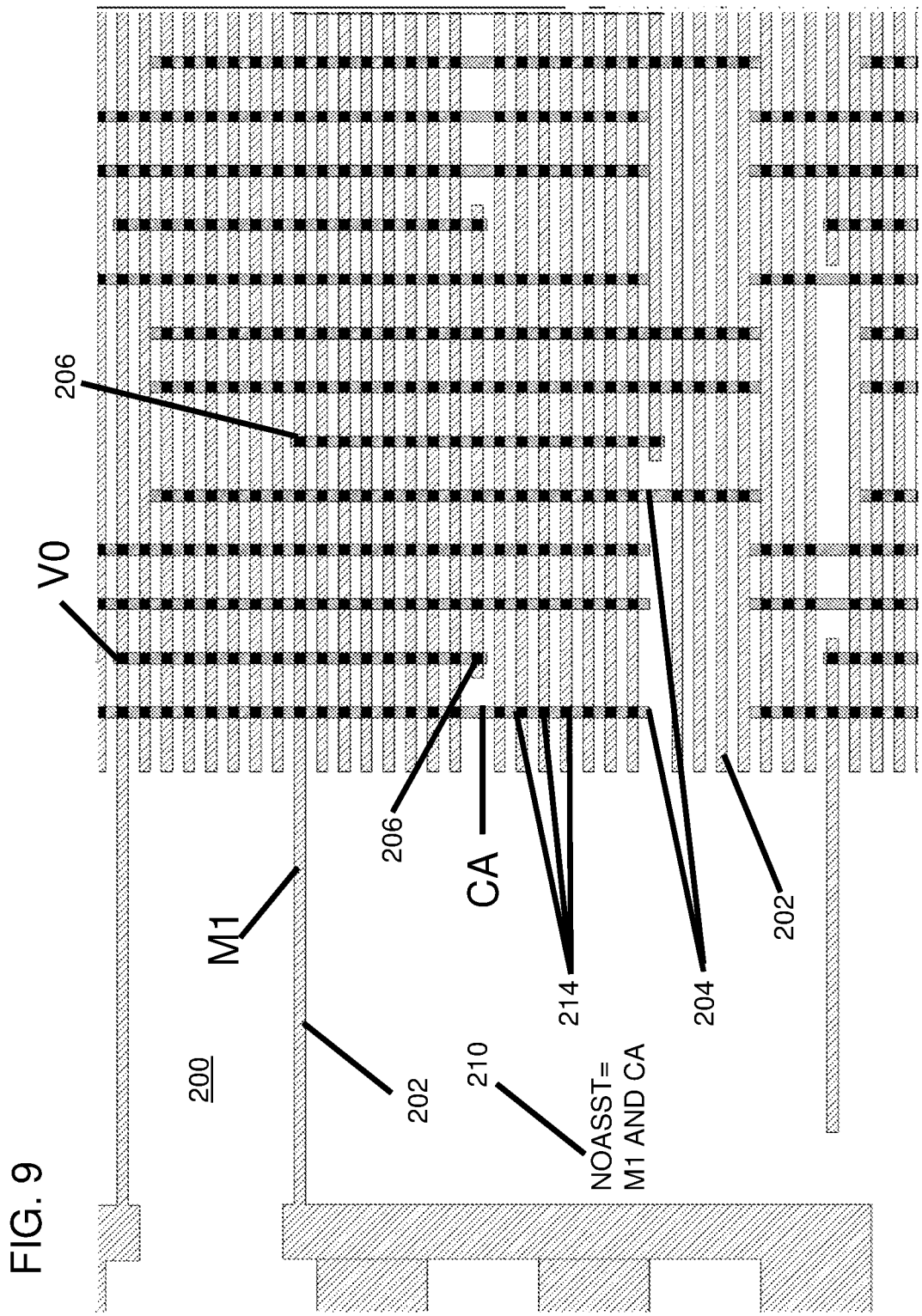
FIG. 9 is an illustrative design layout showing overlap features generated by a Boolean operation to indicate regions where no assist features are allowed in accordance with one embodiment of the present principles.

Referring to FIG. 9, a Boolean operation is carried out between the coordinates in different levels (or the same level) to determine overlap, empty spaces or other features in the design 200. Boolean logic may be designed to determine whether an overlap region 214 occurs at a particular location, its size, its shape, its orientation, etc. The Boolean operation compares pixel locations/coordinates on a desired scale to determine if any overlap occurs. The shape and orientation can be a result of the logic output. In one example, a Boolean function or subroutine called NOASST may be employed. NOASST=M1 AND CA, in one embodiment, to determine locations where overlap between M1 and CA occurs. One location includes, e.g., location 210. Other locations where no overlap occurs are also determined.

Next, the system for determining assist feature placement generates a grid of overlap features 214 that are identified or placed in accordance with the Boolean operation or operations. Here, the Boolean operation includes NOASST=M1 AND CA so locations that meet this criteria are designated as the locations for overlap features 214. In other embodiments, the Boolean operation may include the union of V0 and intersections of M1 and CA; M1 OR CA; M1 AND V0, OR(V0, AND(M0, M1)), etc.

Figure 10:
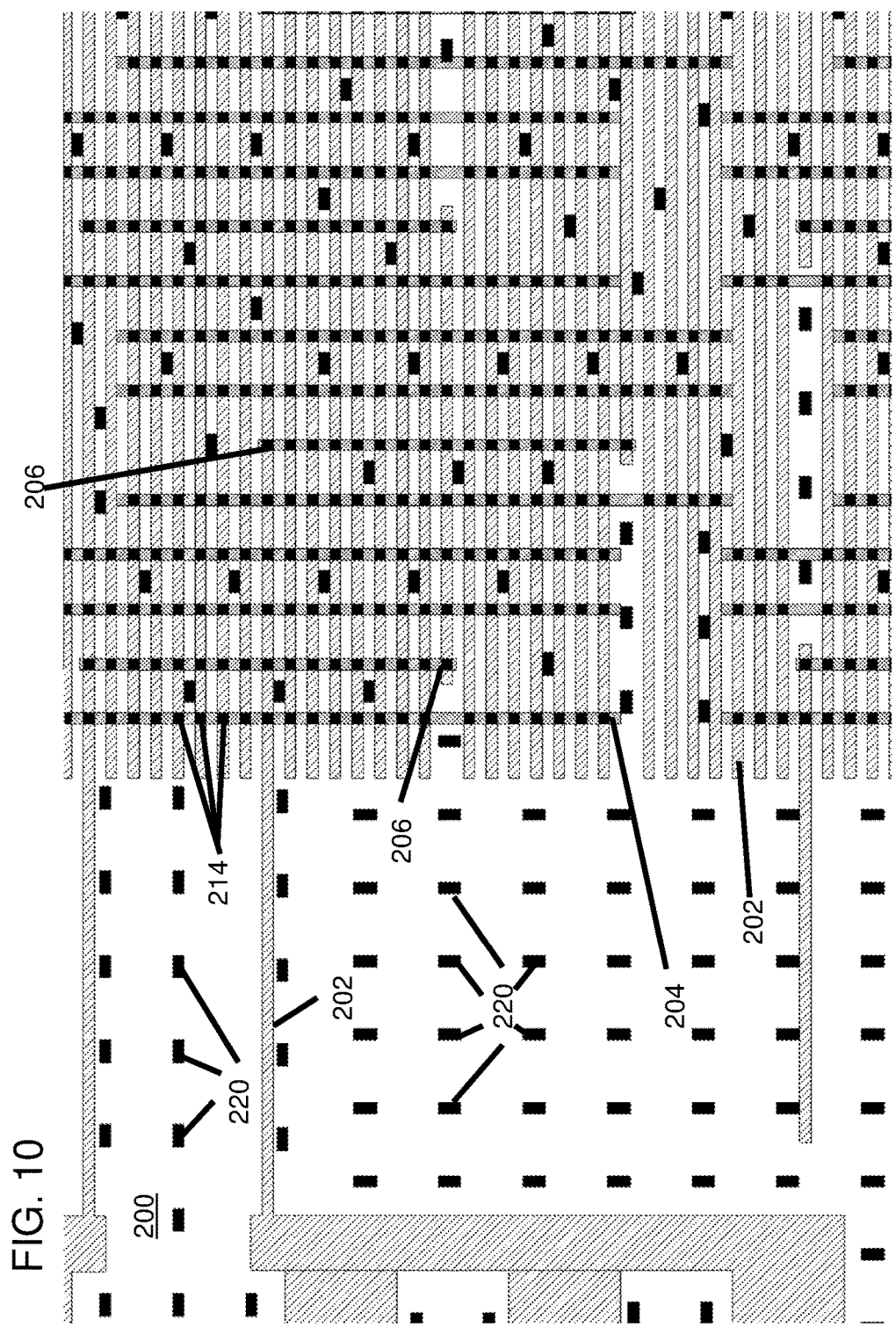
FIG. 10 is an illustrative design layout showing assist features generated in accordance with the design in accordance with one embodiment of the present principles.

Referring to FIG. 10, assist features and/or locations 220 are generated using the one or more Boolean operations that can be configured to enforce design rules. For example, assist features 220 may be placed in areas where there are no metal lines (M1), no contacts (CA) and no vias V0. The assist features' 220 orientation may be selected in accordance with a nearest dominant feature and at a predetermined distance from each other and from other features in the design. The design rules may be changed based upon the design, user preference, previous design rules, process limitations, etc.

The fill of assist features 220 occurs only in regions permitted in accordance with the present principles. Fill areas for whole regions or local positions can be tailored for a particular guide pattern (GP) in which DSA structures are employed for improved pattern density control. In one embodiment, the assist features 220 are placed based on a distance to a nearest NOASST feature/region.

Figure 11:
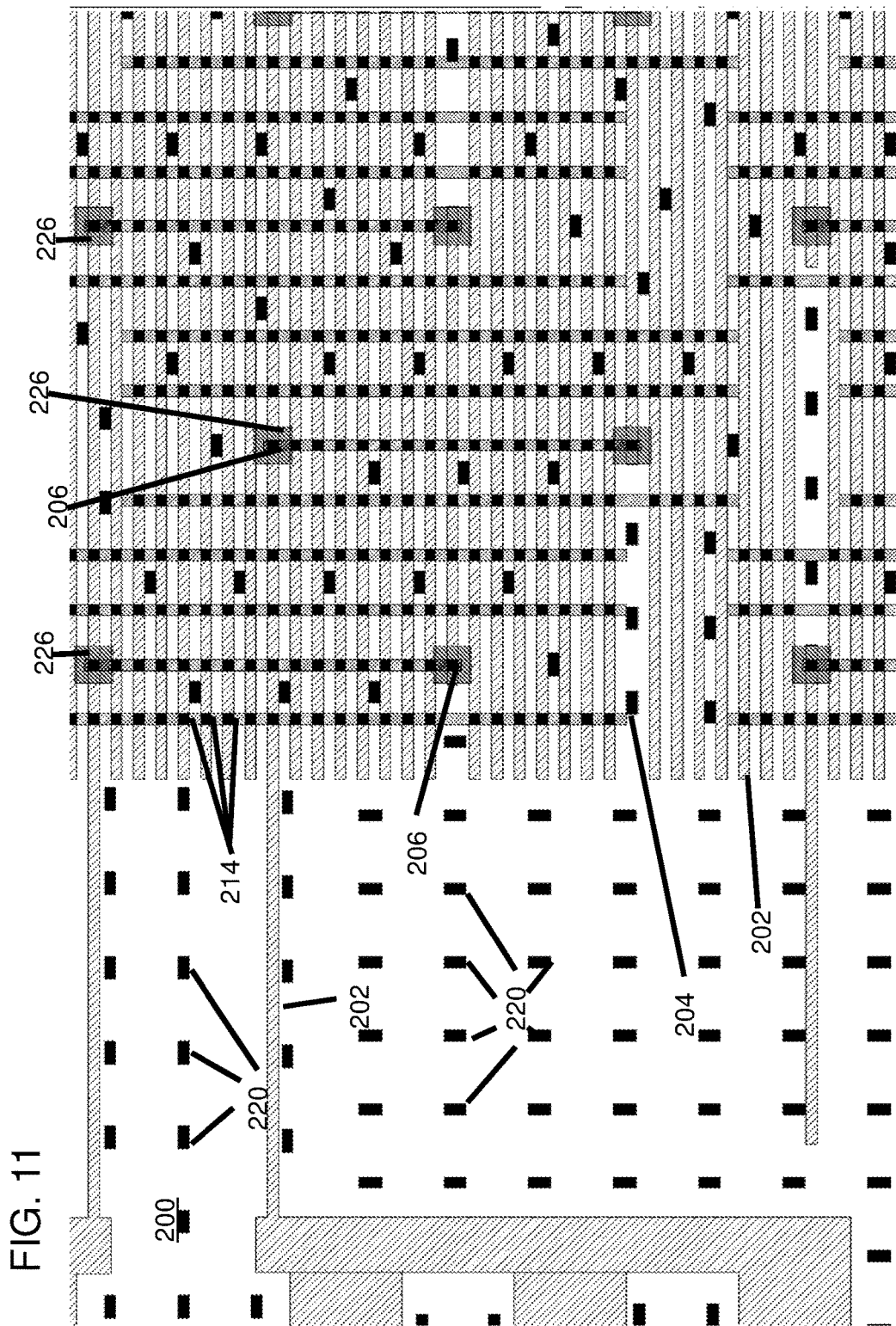
FIG. 11 is an illustrative design layout showing assist features tuned in accordance with one embodiment of the present principles.

Referring to FIG. 11, a size-up step for the main features 206 may be employed to check that critical dimensions (CD) are preserved throughout the design 200. For example, the CD of the design of the V0 206 can be compared to that of the guiding pattern (GP) needed for the intended BCP material. This comparison determines whether the CDs will be met/provided with the given assist features 220. If not, adjustments may be made to provide modified main and assist features to ensure CD requirements are met by the design. Modifications may include dimensional modifications, etch bias corrections, process changes, etc.

A density map of the union of main features 206 and assist features 220 may be generated to check fill density and identify "hot spots" (e.g., regions where the area density is out of a desired range in a specification). If an issue exists, fine tuning may be performed manually or automatically by the system to make corrections. The new guiding pattern may be employed with the assist features 220 as a target to complete OPC processing.

Figure 12:
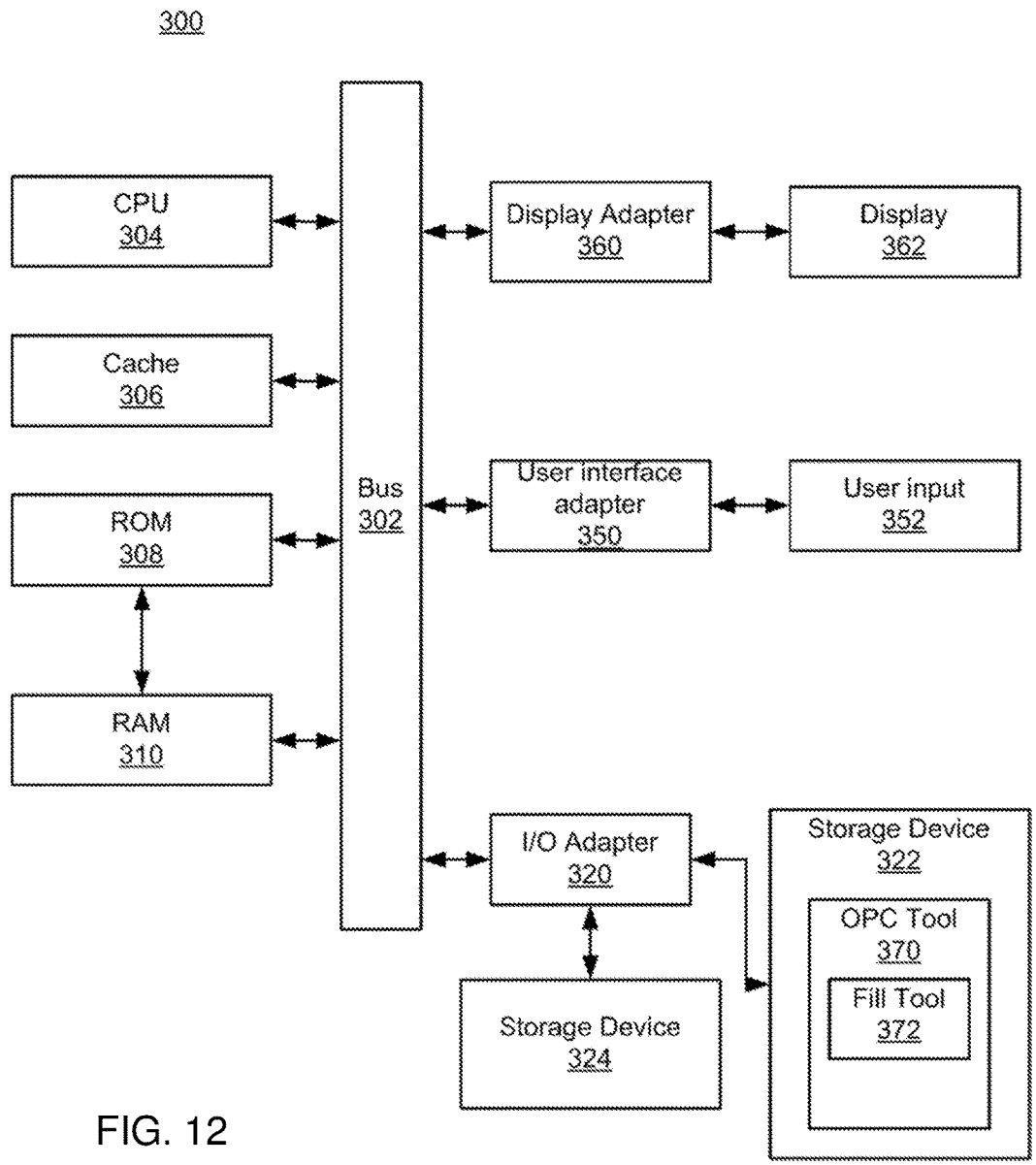
FIG. 12 is a block/flow diagram showing a system/method for pattern density control of a device layout in accordance with one embodiment of the present principles.

Referring to FIG. 12, an exemplary processing system 300 to which the present principles may be applied is shown in accordance with one embodiment. The processing system 300 includes at least one processor (CPU) 304 operatively coupled to other components via a system bus 302. A cache 306, a Read Only Memory (ROM) 308, a Random Access Memory (RAM) 310, an input/output (I/O) adapter 320, a user interface adapter 350, and a display adapter 360, are operatively coupled to the system bus 302.

A first storage device 322 and a second storage device 324 are operatively coupled to system bus 302 by the I/O adapter 320. The storage devices 322 and 324 can be any of a disk storage device (e.g., a magnetic or optical disk storage device), a solid state magnetic device, and so forth. The storage devices 322 and 324 can be the same type of storage device or different types of storage devices. The first storage device 322 may include an OPC tool 370 employed for laying out and modifying lithograph processing images, DSA images or other processing features or steps for semiconductor processing. The OPC tool 370 may include a fill module 372. The fill module 372 may be added to a suite of programs or routines run by the OPC tool 370. In one embodiment, the fill module 372 is employed to design, generate, check and modify a pattern density of main and/or assist features in accordance with the present principles. The fill module 372 receives a design, applies Boolean operations (e.g., NOASST) to determine overlap or other locations and fills the design with assist features. In some embodiments, density checks and other adjustments can also be made using the fill tool 372 and the OPC tool 370.

A display device 362 is operatively coupled to system bus 302 by display adapter 360. A user input device 352 is operatively coupled to system bus 302 by user interface adapter 350. The user input device 352 can be any of a keyboard, a mouse, a keypad, an image capture device, a motion sensing device, a microphone, a device incorporating the functionality of at least two of the preceding devices, and so forth. Of course, other types of input devices can also be used, in accordance with the present principles. The user input device 352 is employed to input and output information to and from system 300.

The processing system 300 may also include other elements (not shown), as readily contemplated by one of skill in the art, as well as omit certain elements. For example, various other input devices and/or output devices can be included in processing system 300, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 300 are readily contemplated by one of ordinary skill in the art given the teachings of the present principles provided herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 13:
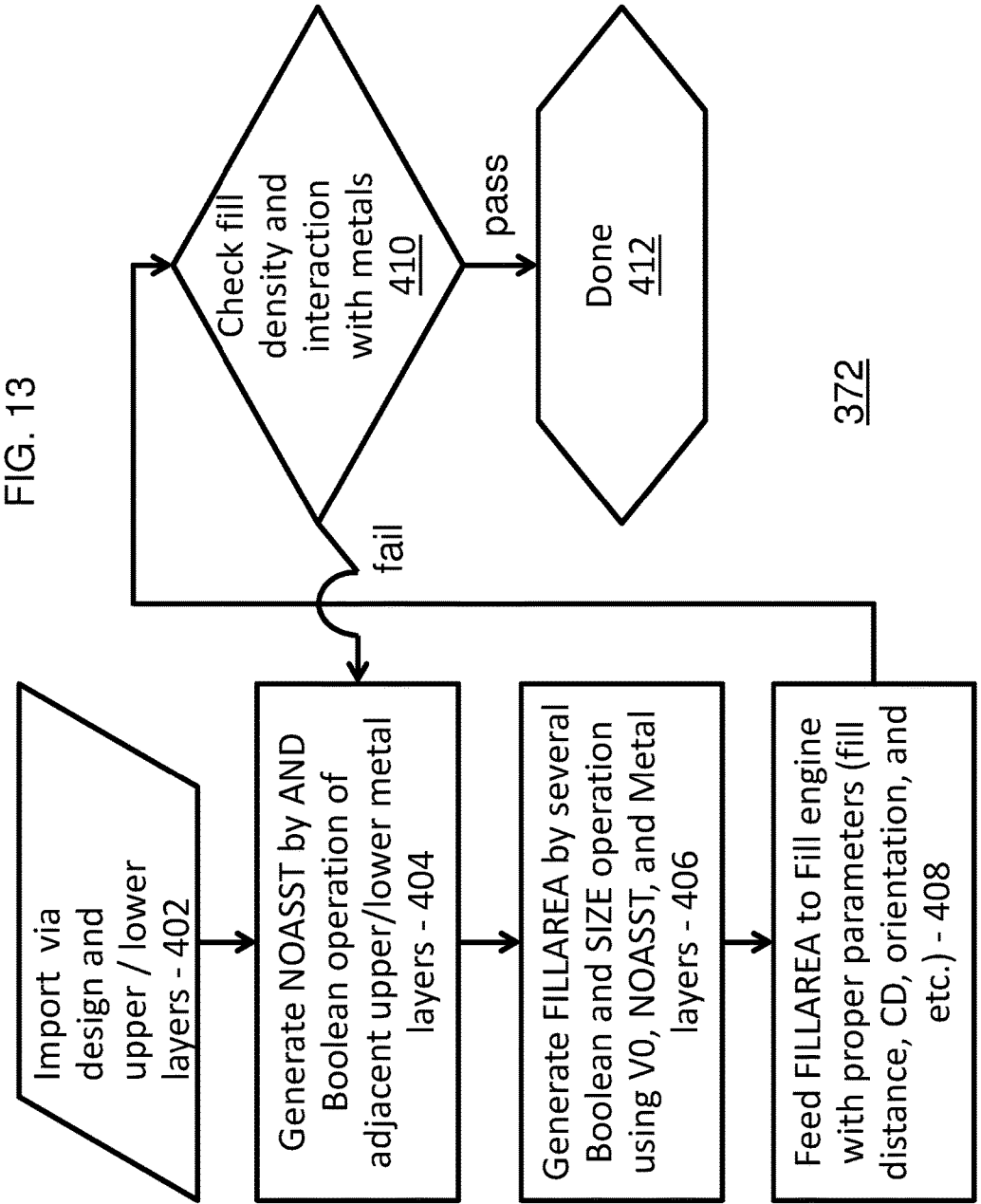
FIG. 13 is a block/flow diagram showing a system/method for pattern density control of a device layout in greater detail in accordance with another embodiment of the present principles.

Referring to FIG. 13, a block/flow diagram showing a program flow for a design-aware assist feature device is depicted in accordance with the present principles. The method reduces pattern density-induced graphoepitaxy DSA defects on real circuit patterns by introducing under-sized dummy patterns at specific regions determined by a design-aware approach. Design-aware relates to employing design specific features and components (e.g., metal lines between layers) to place and size assist features. In block 402, a layout design is imported into the module 372 (FIG. 12). The layout design includes two or more layers of components, such as, e.g., metal lines, contacts, plates, etc. The layout may be in any standard format. The design and procedure preferably are employed for DSA manufacturing processes.

In block 404, an area(s) is defined to avoid assist features, e.g., NOASST=M0 AND M1. A Boolean map is generated (e.g., using NOASST) by a logic operation (e.g., AND, OR, etc.) or combinations thereof between two or more layers. In block 406, a fill of assist features is generated using a FILLAREA routine. The FILLAREA routine is responsive to and considers the permissible locations in accordance with user selections and Boolean operation. An area(s) is/are defined to fill by operations on NOASST, and layers, e.g., V0, M0, M1, etc. together with pinching and/or bridging cleanup operations, which result in a FILLAREA layout result. The fill may be applied using criteria such as, e.g., one or more Boolean operations, a SIZE operation using V0 or other features that are sized to ensure CD requirements are met, etc. The FILLAREA routine employs information generated by NOASST, and the metal layer layouts to determine areas/regions where the assist features are allowed so that the assist features can only be generated in these areas/regions to create the FILLAREA. Sizes and orientations of the assist features can be determined based on the layouts, Booleans operations, etc. to ensure high quality assist features and layout structures to be produced for DSA technology. This can be achieved by employing a SIZE routine to consider these and other criteria.

In block 408, the FILLAREA output from the FILLAREA routine may be fed to a fill engine or program (e.g., OPC software) with specified parameters to be checked. The specified parameters may include fill distances, CDs, orientations, hot spot checks, distances between dummy/assist features (fill) and main features, distances between dummy/assist features and nearby dummy/assist features, orientations, etc.

In block 410, a fill density is checked against a preset density threshold. Also, a metal interaction check is performed to make sure that the features of the layout will not short against each other (e.g., make sure no assist features are interacting with metals). If the check passes, the design is complete in block 412. Otherwise, the program path returns to block 404 with additional corrections/restrictions and is run until a pass is achieved in block 410. As a result local assist features are independent from global fill patterns. This provides better density control and better fabrication outcomes.

Figure 14:
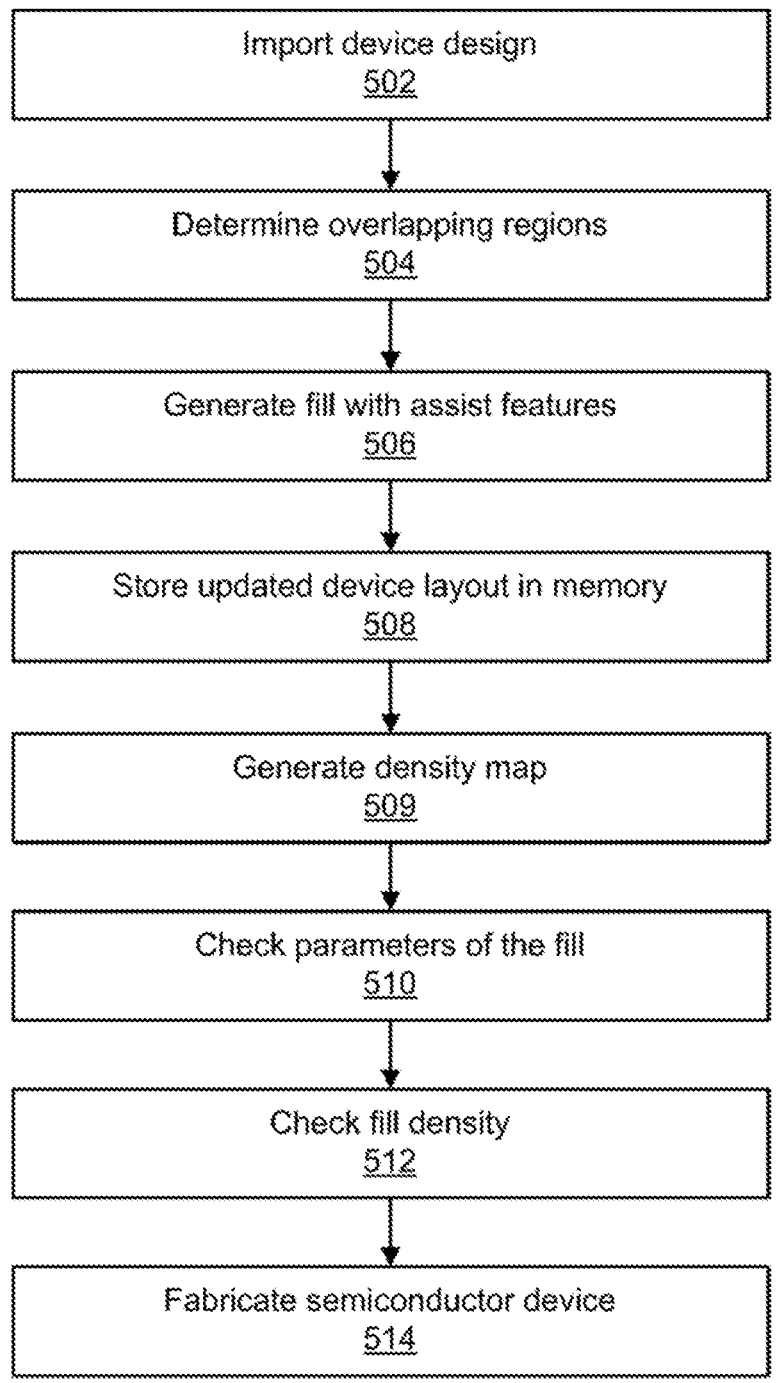
FIG. 14 is a block/flow diagram showing a system/method for pattern density control of a device layout in accordance with another embodiment of the present principles.

Referring to FIG. 14, a method for pattern density control of a device layout is illustratively shown in accordance with another embodiment. In block 502, a multi-layer semiconductor device design is imported into an assist feature system. In block 504, overlapping regions are determined between two or more layers in the multi-layer semiconductor device design using at least one Boolean operation. In block 506, a fill for assist features is generated to provide dimensional consistency of device features by employing at least the overlapping regions to provide placement of the assist features. In block 508, an updated device layout is stored in a memory device. In block 509, a density map is generated for display on a display device, and the density of the assist features is fine-tuned using the density map.

In block 510, the fill is fed to a fill engine (e.g., OPC) to check parameters of the fill. The parameters of the fill may include one or more of fill distance, critical dimensions, fill orientations, etc. In block 512, fill density is checked against a density specification. If the fill density is outside the density specification, the path returns to the step of determining overlapping regions in block 504 and continues. In block 514, a semiconductor device having the assist features of the fill formed on layers of the semiconductor device is fabricated. In one embodiment, the semiconductor device with the assist features is fabricated using a directed self-assembly process.

Having described preferred embodiments for design-aware pattern density control in directed self-assembly graphoepitaxy process (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for pattern density control of a device layout, the method comprising:
   importing a multi-layer semiconductor device design into an assist feature generation system;
   determining prohibited regions and allowed regions for assist features based on overlapping regions between two or more layers in the multi-layer semiconductor device design using at least one Boolean operation;
   generating a fill for the assist features to provide dimensional consistency of device features by employing at least the overlapping regions to provide placement of the assist features; and
   storing an updated device layout in a memory device.

2. The method as recited in claim 1, further comprising feeding the allowed regions to a fill engine to create the fill and to check parameters of the fill.

3. The method as recited in claim 2, wherein the parameters of the fill include one or more of each of: a fill distance between assist features to main features, a critical dimensions and a fill orientation.

4. The method as recited in claim 1, further comprising checking fill density against a density specification.

5. The method as recited in claim 4, wherein if the fill density is outside the density specification, returning to the determining overlapping regions step.

6. The method as recited in claim 1, further comprising fabricating a semiconductor device having the assist features of the fill formed on layers of the semiconductor device.

7. The method as recited in claim 6, wherein the fabricating step includes fabricating the assist features using a directed self-assembly process.

8. The method as recited in claim 1, further comprising generating a density map for display on a display device and fine-tuning density of the assist features using the density map.

9. A non-transitory computer readable storage medium comprising a computer readable program for pattern density control of a device layout, wherein the computer readable program, when executed on a computer, causes the computer to perform steps of:
- importing a multi-layer semiconductor device design into an assist feature system;
- determining overlapping regions between two or more layers in the multi-layer semiconductor device design using at least one Boolean operation;
- generating a fill for assist features to provide dimensional consistency of device features by employing at least the overlapping regions to provide placement of the assist features; and
- storing an updated device layout in a memory device.

10. The non-transitory computer readable storage medium as recited in claim 9, wherein the computer readable program further causes the computer to perform a step of feeding the fill to a fill engine to check parameters of the fill.

11. The non-transitory computer readable storage medium as recited in claim 10, wherein the parameters of the fill include one or more of each of: fill distances, critical dimensions and a fill orientation.

12. The non-transitory computer readable storage medium as recited in claim 9, wherein the computer readable program further causes the computer to perform a step of checking fill density against a density specification.

13. The non-transitory computer readable storage medium as recited in claim 12, wherein if the fill density is outside the density specification, returning to the step of determining overlapping regions.

14. The non-transitory computer readable storage medium as recited in claim 9, wherein the computer readable program further causes the computer to perform a step of fabricating a semiconductor device layout having the assist features of the fill included on layers of the semiconductor device layout.

15. The non-transitory computer readable storage medium as recited in claim 14, wherein the fabricating step includes fabricating the assist features using a directed self-assembly process.

16. The non-transitory computer readable storage medium as recited in claim 9, wherein the computer readable program further causes the computer to perform a step of generating a density map for display on a display device and fine-tuning a density of the assist features using the density map.

17. A semiconductor device, comprising:
- multiple metallization layers;
- at least one region determined to be free of assist features based upon a presence of an overlap between metal layers between the multiple metallization layers of the device; and
- a fill for assist features formed on one or more layers of the semiconductor device to provide dimensional consistency of device features, the assist features being placed in accordance with the overlap to provide placement of the assist features.

18. The device as recited in claim 17, wherein the assist features are placed in accordance with one or more of: a fill distance from the device features to other assist features, critical dimensions of the device features and a fill orientation relative to the device features.

19. The device as recited in claim 17, wherein the assist features include directed self-assembly assist features.

20. The device as recited in claim 17, wherein the assist features include a material selected from the group consisting of poly(styrene), poly(methyl methacrylate) and poly(hydroxystyrene) diblock copolymers.

* * * * *